United States Patent
Zaitsev et al.

(10) Patent No.: US 8,018,230 B2
(45) Date of Patent: Sep. 13, 2011

(54) SENSE SHIMMING (SSH): A FAST APPROACH FOR DETERMINING B0 FIELD INHOMOGENEITIES USING SENSITIVITY ENCODING

(75) Inventors: Maxim Zaitsev, Freiburg (DE); Daniel N. Splitthoff, Freiburg (DE); Jürgen Hennig, Freiburg (DE)

(73) Assignee: Universitaetsklinikum Freiburg, Freiburg (DE)

( * ) Notice: Subject to any disclaimer, the term of this patent is extended or adjusted under 35 U.S.C. 154(b) by 146 days.

(21) Appl. No.: 12/258,779

(22) Filed: Oct. 27, 2008

(65) Prior Publication Data
US 2010/0102819 A1  Apr. 29, 2010

(51) Int. Cl.
*G01V 3/00* (2006.01)
(52) U.S. Cl. ........................................................ 324/309
(58) Field of Classification Search .......... 324/300–322; 600/410–435
See application file for complete search history.

(56) References Cited

U.S. PATENT DOCUMENTS

| | | | | |
|---|---|---|---|---|
| 4,134,058 A | * | 1/1979 | Ernst | 324/307 |
| 4,740,753 A | * | 4/1988 | Glover et al. | 324/320 |
| 5,218,299 A | * | 6/1993 | Dunkel | 324/307 |
| 6,509,735 B2 | * | 1/2003 | Mueller et al. | 324/307 |
| 7,019,523 B2 | * | 3/2006 | Ikezaki | 324/309 |
| 7,348,775 B2 | * | 3/2008 | Weiger et al. | 324/307 |
| 7,411,395 B2 | * | 8/2008 | Hennig | 324/307 |
| 7,605,589 B2 | * | 10/2009 | Weiger et al. | 324/320 |
| 7,791,341 B2 | * | 9/2010 | Ikeda | 324/309 |

* cited by examiner

*Primary Examiner* — Dixomara Vargas
(74) *Attorney, Agent, or Firm* — Walter A. Hackler (57) ABSTRACT

The pursuit for ever higher field strengths and faster data acquisitions has led to the construction of coil arrays with high numbers of elements. With the SENSE technique it has been shown, how the sensitivity of those elements can be used for spatial image encoding. A method in accordance with the present invention, largely abstains from using encoding gradients. The resulting sensitivity encoded free induction decay (FID) data is then not used for imaging, but for determining field inhomogeneity distribution. The method has therefore been termed SSH for Sense SHimming.

16 Claims, 6 Drawing Sheets

SENSE SHIMMING (SSH): A FAST APPROACH FOR DETERMINING B0 FIELD INHOMOGENEITIES USING SENSITIVITY ENCODING

Although modern MR scanners produce highly homogeneous fields, this is often more than counterbalanced by the increased susceptibility effects at field strengths of 3 Tesla and higher. Therefore the scanners are equipped with a set of shim coils which can be used for reversing the effects of the subject-induced B0 inhomogeneities, with the access to the adjustments of these coils depending strongly on the manufacturer.

Different shimming methods have been proposed, depending on the inhomogeneity order to be corrected, ranging from acquisitions of projections along the three axes for the linear case, or along selected diagonals for additional second orders, to 2D and 3D field maps, every method being a tradeoff between acquisition speed and accuracy.

For imaging, the concept of reducing acquisition time by using coil arrays was introduced by Pruessmann et al. with the well-known SENSE technique (Magn. Reson. Med, 42(5): 952-962, November 1999). As shown, the spatially varying sensitivities of the individual coil elements can be used as additional spatial encoding information. This allows for reducing the amount of needed phase encoding steps while usually keeping the k-space extent unchanged; thus the acquisition time can be shortened by a reduction factor R, with the number of coil elements being the theoretical maximum, which usually cannot be achieved. Since a given set of pixels folds into a single pixel, an estimate of the original image can be obtained by reconstructing separate images for the individual coil elements and using previously measured sensitivities for resolving the original pixel intensities.

SUMMARY OF THE INVENTION

A magnetic resonance (NMR) method for fast detection and correction of B0 field inhomogeneities in an NMR apparatus, in accordance with the present invention utilizes a coil array consisting of multiple separate elements, and extracting information on a spatial distribution of resonance frequencies using sensitivity differences from the coil array and using one or several previously acquired reference data sets and one or several points on a free induction decay (FID), and adjusting currents in field manipulation coils of the NMR apparatus.

BRIEF DESCRIPTION OF THE DRAWINGS

The advantages and features of the present invention will be better understood by the following description when considered in conjunction with the accompanying drawings in which:

FIG. 5) can be observed. Furthermore, errors are very low, especially for the second orders.

DETAILED DESCRIPTION

Figure 1:
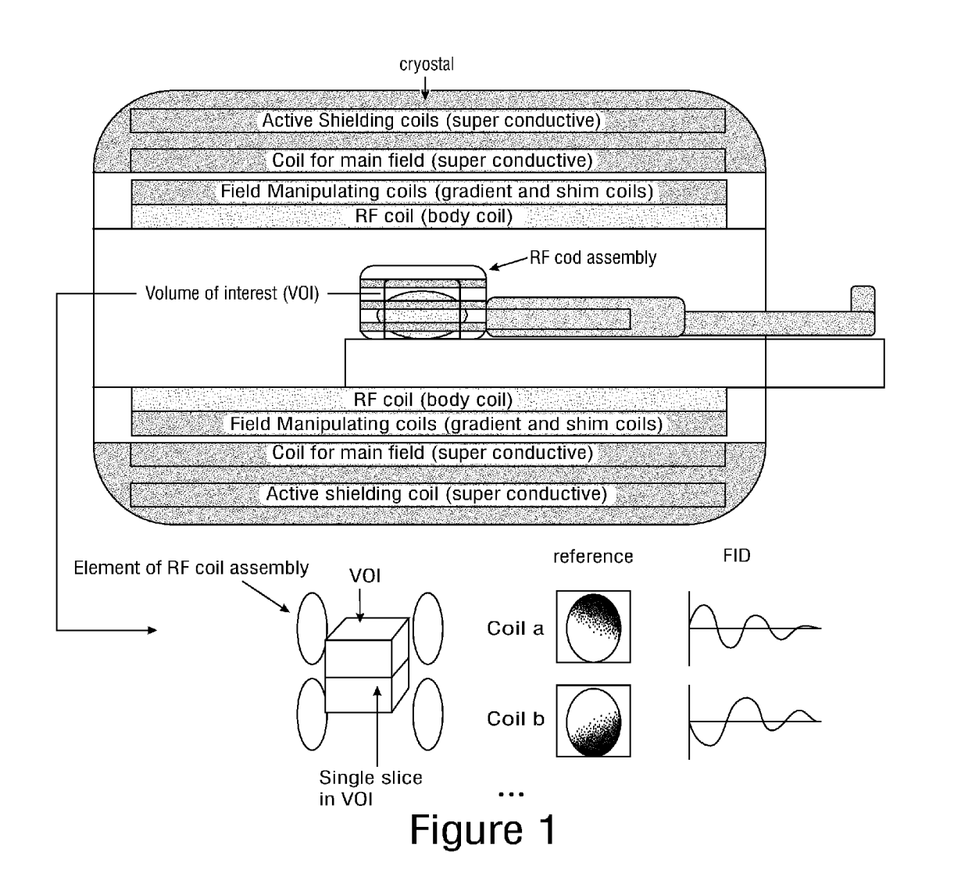
FIG. 1 is a schematic representation of NMR apparatus suitable for use with the present invention method showing a multiple separate element coil arrays along with volume of interest, and slices of volume of interest.
Figure 2:
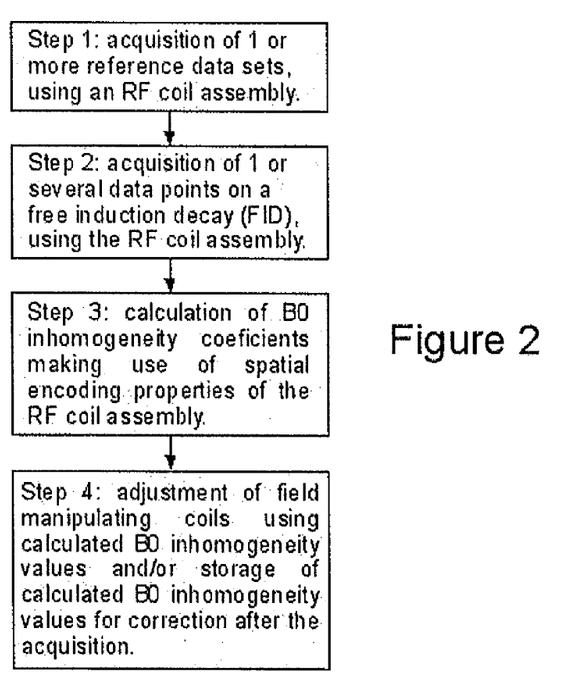
FIG. 2 is a flow chart illustrating the main steps of the method in accordance with the present invention.

The method in accordance with the present invention utilizing the apparatus illustrated in FIG. 1 and represented in the following chart shown in FIG. 2, abstains completely from using traditional frequency and phase encoding, thus yielding a fold-over of all pixels into one, that is observing a discrete point on a free induction decay (FID); hereinafter, this single point is referred to as "FID point". The question addressed, whether the FID points seen by the elements of a coil array, along with the respective sensitivities, can be used to assess B0 field inhomogeneities.

The B0 inhomogeneities are described using reasonable model functions, for example a spherical harmonic set, with a number $N_{inhom}$ of coefficients. It is clear that for the described method the number of coil elements, $N_{coil}$, will be a the theoretical upper limit for $N_{inhom}$; it will not be a limit for R, since for an FID point R corresponds to the total number of image pixels (the overall maximum reduction factor $R_{max}$ throughout the text). The question can be reformulated as follows: is it possible to transform information from the coil array space into field inhomogeneity space? Note that this task is substantially different from imaging, where information needs to be transformed to image space, which is described by a much higher number of free parameters.

Theory
Basic Framework

The FID signal received in element n of a coil array at time t without gradient encoding can be described as follows:

$$\Psi_n(t) = \int_{dV} \rho(\vec{r}) s_n(\vec{r}) e^{i\omega(\vec{r})t} d\vec{r} \qquad (1)$$

$$= \int_{dV} \rho(\vec{r}) s_n(\vec{r}) e^{i\omega(\vec{r})t_0} e^{i\omega(\vec{r})\Delta t} d\vec{r}$$

$$= \int_{dV} \rho'_n(\vec{r}, t_0) e^{i\omega(\vec{r})\Delta t} d\vec{r}$$

where $\rho'_n(\vec{r}, t_0) = \rho(\vec{r}) s_n(\vec{r}) e^{i\omega(\vec{r})t_0}$; $\rho(\vec{r})$ and $s_n(\vec{r})$ are the real spin density and the complex sensitivity for coil n, respectively. $\omega(\vec{r})$ describes the B0 field inhomogeneities at point $\vec{r}$ and is assumed to be static for the time frames under consideration; $\Delta t = t - t_0$. For small inhomogeneities and/or short $\Delta t$ the exponential function in Equation 1 can be approximated to $e^{i\omega(\vec{r})\Delta t} \approx 1 + i\omega(\vec{r})\Delta t$ and the full equation reads $$\Psi_n(t) \approx \int_{dV} \rho'_n(\vec{r}, t_0) d\vec{r} + i\Delta t \int_{dV} \rho'_n(\vec{r}, t_0) \omega(\vec{r}) d\vec{r} \qquad (2)$$

Measuring $\Psi_n(t)$ and assuming $\rho'_n(\vec{r}, t_0)$ to be known for a given $t_0$, would thus leave $\omega(\vec{r})$ as the only unknown in the equation. Fortunately $\rho'_n(\vec{r}, t_0)$ corresponds to the reconstructed image for coil n for a gradient echo (GRE) sequence with TE=$t_0$. The somewhat difficult calculation of pure sensitivity maps is therefore not necessary. Calculating the discrete derivative, $d_n$, of Equation 2 yields $$d_n = -i(\Psi_n(t_0 + \Delta t) - \Psi_n(t_0))/\Delta t \qquad (3)$$

$$\approx \int_{dV} \rho'_n(\vec{r}, t_0) \omega(\vec{r}) d\vec{r}.$$

In order to solve Equation 3 for $\omega(\vec{r})$ the true inhomogeneity needs to be replaced with a model, $\omega(\vec{r}) \approx \Sigma \beta_i B_i(\vec{r})$, where $B_i(\vec{r})$ are the basis functions corresponding to the relevant field distributions and $\beta_i$ the respective weights that need to be found.

In the discrete case, assuming the resolution of the reference image to be L×M, Equation 3 can be rewritten in matrix formalism (r is the discrete subset of $\vec{r}$): by setting $v_n = d_n$ (a N×1 vector), $P_n = \rho'_n(r, t_o)$ (a N×(L*M) matrix) and $B\beta = \omega(r)$, with B and $\beta$ being a (L*M)×$N_{inhom}$ matrix and a $N_{inhom}$×1 vector, respectively, the following over determined system of equations results:

$$PB\beta = v \qquad (4)$$

This can easily be solved in the least square sense for the vector of coefficients, $\beta$. The real valued weights can be obtained by simultaneously fitting the real and the imaginary part of Equation 4.

Extension for R<$R_{max}$

As mentioned, the method described above can be considered an extreme case of the SENSE approach, with all pixels folding into one, i.e. with a maximum reduction factor $R_{max}$; the other extreme would be standard imaging, with no foldovers, i.e. SENSE with R=1. In the first case, spatial information is encoded exclusively via coil sensitivities. If this is not sufficient in order to determine the B0 field inhomogeneities, additional encoding can be applied using linear field gradients, thus reducing R. Equation 1 then becomes:

$$\Psi_{n,k}(t) = \ldots = \int_{dV_k} \rho'_n(\vec{r}, t_0) e^{i\omega(\vec{r})\Delta t} d\vec{r} \qquad (5)$$

where $V_k$ determines the sub volume of volume V that folds into a pixel $\Psi_{n,k}(t)$. This can be understood by the following considerations: ideally the FID point needed for the first case can be thought of as having been obtained by successively removing k-space data from the conventional 2D k-space of the reference image, in any desired pattern, eventually resulting in an FID point where all pixels fold into one. This k-space removal can be carried out by either modifying the total k-space extent, modifying the k-space resolution, or, interestingly, by a combination of both.

Figure 3:
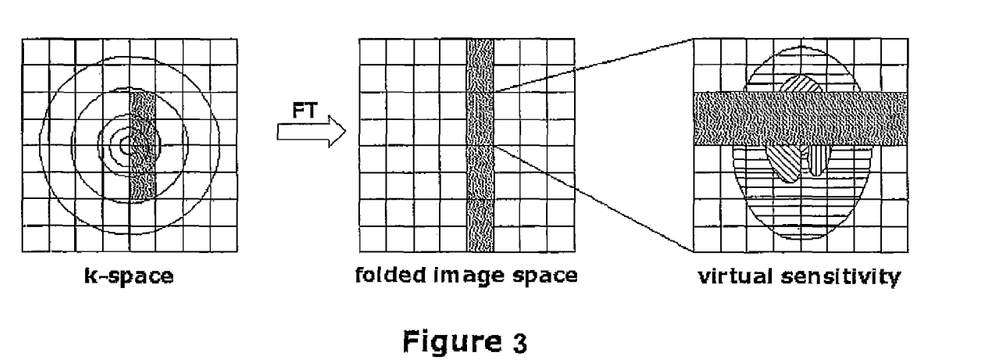
FIG. 3 with FIGS. 1-2 represent is a schematic illustration of the presented SSH method with a reduction factor R less than maximum (here $R=R_{max}/4$, cf. text): if pure sensitivity information is not sufficient for solving Equation 4, additional encoding can be obtained by acquiring phase encoded FID points (here illustrated by the filled boxes); after Fourier transformation, this leads to only partial fold-overs or integrations, which can be considered additional virtual sensitivities. The filled boxes in the virtual sensitivity represent the pixel that fold into a single pixel in the folded image space.

This process can as well be iteratively undone by acquiring FID points with phase encoding, in addition to the unencoded FID point. A first step would consist of adding an FID point in one direction, either corresponding to the maximum or minimum k-space-distance to the FID point (respective to the reference image). When Fourier transformed, the respective two points would result either in a very small field of view (FOV) and a very high number of fold-overs or in a very low resolution and no fold-overs at all. But again, any transition in between would be possible. More encoded FID points can easily be added, leading to predictable patterns of fold-overs and integrations. Those patterns can be used to spatially combine signal from different regions of the object, leading to additional virtual coil sensitivities, which are multiplied with the sensitivities from the coil array. The thus obtained sub-sensitivities can be used as described in Equation 4. Note that those virtual sensitivities need not to be contiguous. For clarification of this scenario, a situation with low resolution in image space is depicted in FIG. 3.

Excitation

As explained above in "Basic Framework" the FID data and the reference data have to be consistent, i.e. the reference data has to adequately describe the magnetization that leads to the FID signal. It has to be noted though, that if this requirement is met the way the data are acquired is not of importance.

The most straightforward case is to obtain the reference data and/or the FID data each after exciting a single slice of a volume of interest (VOI).

Another approach is to use several reference and/or FID data sets for the presented algorithm, consisting of several single slices of the VOI, whereby the orientation of the slices relative to each other can be arbitrary.

Furthermore, the excitation does not have to be performed on a slice by slice basis, arbitrary regions of a VOI can be excited, as long as the requirement of consistency is fulfilled. Excitation of a 3D slab prior to the acquisition of the reference and/or HD data is possible, as well as exciting other arbitrary patterns, using specialized techniques, such as multidimensional selective excitation or parallel excitation.

Note that the reference data and the FID data do not have to represent magnetization excited over a contiguous region.

Furthermore, the excitation pattern for the reference data and the FID data can be different, as long as the consistency requirement is fulfilled in order to solve Equation 4.

Furthermore, the excitation can be preceded and/or combined by/with saturation techniques, in order to saturate signals from undesired spectral or spatial components.

Dynamic Approach

For cases where the fields generated by the shim coils are well determined, an iterative approach can yield higher accuracy or can otherwise be used in dynamic applications. The first iteration is performed as described above. In the following iterations the shim settings are adjusted and only the FID points are acquired, whereas $\rho'_n(\vec{r}, t_0)$ is calculated based on the B0 inhomogeneities detected during the last iteration. Be k+1 the index for the current iteration, then the following equation results:

$$\rho'_{n,k+1}(\vec{r}, t_0) = \rho'_{n,k}(\vec{r}, t_0) e^{iB\beta_k t_0} \qquad (6)$$

It has to be noted, that in order to detect B0 field inhomogeneities of an arbitrary volume of interest (VOI) the presented algorithm can be used such that: a) the problem is solved by dividing the problem into several two dimensional problems, using basis functions in two dimensions or b) solving the problem directly in three spatial dimensions, using basis functions in three spatial dimensions, i.e. using all the available data simultaneously or c) by combining a) and b) for different sub volumes.

Note that time can be used as an additional dimension for the basis functions and therefore for representing the B0 field inhomogeneity information and its dynamics.

Note that the exponential function does not need to be approximated, which might lead to improved accuracy. Since it is crucial to acquire the data in a steady state, the described setup only makes sense, if each iteration corresponds to one TR in a single measurement. The method relies on fast shim coil adjustment and on real-time calculations, which both depend strongly on the hardware.

Noise Considerations

It is clear that the approximation of the exponential function in Equation 2 will be approaching unity, both for $\Delta t$ being close to the usual dwell time, $T_{dwell}$, i.e. in the order of microseconds, as well as for small B0 inhomogeneities. In those cases the derivative in Equation 3, $d_n$, is dominated by noise. $\Delta t$ has therefore to be chosen with care, in order to obtain sufficiently high signal in Equation 3 and, on the other hand, still fulfil the approximation condition. In the case of discrete time steps we can write $t=f\Delta t$, and call f a window width factor.

In order to assess the effect of noise in dependence of f, the noise can be assumed to originate exclusively from the sample. The noise can then be modelled in terms of image SNR, which is usually defined as $SNR=S/\sigma_{noise}$, with S being the signal intensity. For the standard deviation of the noise thus results: $\sigma_{noise}=S/SNR$. Under the described simplifying assumptions the noisy unencoded FID signal can then be written as follows:

$$\Psi_n(t) = \int_{dV} \rho'_n(\vec{r}, t_0) e^{i\omega(\vec{r})f\Delta t} d\vec{r} + \int_{dV} \varepsilon(\vec{r}, t) d\vec{r}, \qquad (7)$$

with $\varepsilon(\vec{r},t) \square N(0,\sigma_{noise}^2)$. Equation 3 becomes $$d_n = -i\Phi(f)/(f\Delta t) \approx \int_{dV} \rho'_n(\vec{r}, t_0) \omega(\vec{r}) d\vec{r}, \qquad (8)$$

with $$\Phi(f) = \Psi_n(t_0 + f\Delta t) - \Psi_n(t_0) - \int_{dV} \varepsilon(\vec{r}, t_0 + f\Delta t) d\vec{r} + \int_{dV} \varepsilon(\vec{r}, t_0) d\vec{r}. \qquad (9)$$

It can be seen that, since the noise is assumed to be stationary, its contribution to the equation reduces with increasing f. In order to further reduce noise, it seems advisable to estimate the discrete slope over several FID data points, in a least-square sense; hereinafter the factor f will thus additionally be used to denote the number of points taken into account instead of only the maximum temporal distance. Again, Equation 8 is only valid as long as the approximation condition is fulfilled.

It is to be noted that f might not be optimal for all coil elements at the same time; the derivative in Equation 3 can be estimated using weighted fitting (e. g. [8]) and setting magnitude differences as weights, resulting in a coil dependent $f_n$; this implies the assumption that in the time frame under consideration magnitude differences are caused by interferences only (constructive or destructive).

EXAMPLES

Phantom Experiments

All data were acquired on a 3T Tim Trio Magnetom (Siemens Medical Solutions, Erlangen, Germany), using a 12 channel coil array with the longitudinal elements arranged side-by-side on the circumference of a cylinder, measuring a doped water bottle with a diameter of 16 cm. A product spoiled GRE sequence (FLASH) was modified to allow for acquiring further FID signals following the image k-space. Since spoiled GRE sequences reach steady state rather fast, no problems related to steady state transitions were to be expected. Parameters common to all measurements were the followings: TE: 3 ms, TR: 20 ms, FOV: 0.2 m, BW/px: 500 Hz, resolution: 128×256, slice thickness: 5 mm, transverse slice orientation. The number of unencoded FID lines, $N_{unenc}$, was chosen to correspond to the number of image phase encoding steps, i.e. 128, in order to be able to calculate error estimates.

Basis Functions

The basis functions to be fitted in Equation 4 play an important role; it is therefore worth pointing out a slightly misleading use of the term "spherical harmonics" in MR literature. In contrast to theoretical physics, where spherical harmonics refer to a set of functions orthogonal on the unit sphere, in MR a radial term is implicitly added, which, strictly speaking, has to be referred to as solid harmonics. Very importantly, solid harmonics are not orthogonal, which leads for example to higher orders appearing as lower orders, if not fitted; similarly, shifts of higher orders result in errors in the lower orders (e.g. [9]). In general the basis functions should obviously correspond to the fields actually generated by the shim coils (note that this definition includes gradient coils as well). For the experiments carried out for this note, the fields were qualitatively checked to correspond to the desired patterns and found to fulfil the requirements for a proof of principle study; for more exact results, the generated fields along with possible cross-terms would need to be measured.

Results

Simulations

Figure 4A:
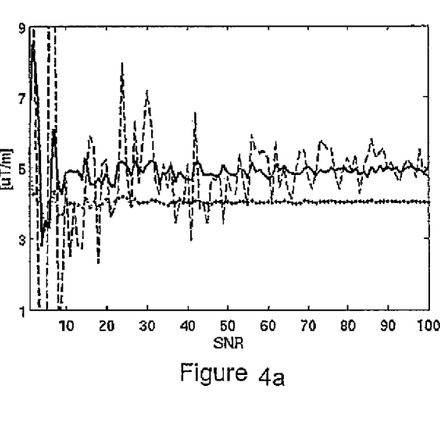
FIGS. 4a and 4b show a comparison of the two modes for f, a) as the temporal distance and b) as the temporal range of the values to be considered. Shown are the detected values for f=100 (dashed line), f=500 (solid line) and f=2000 (dotted line) for a simulated inhomogeneity of 5µT/m in Y direction, in the presence of noise (SNR =1 . . . 100). Results become in general more stable but less accurate with higher f values: instead of 5µT/m an inhomogeneity of about 4µT/m is detected for f=2000 (dotted line). It is therefore crucial that f be neither too high nor too low. Results improve when using a range of points (b), as expected.
Figure 4B:
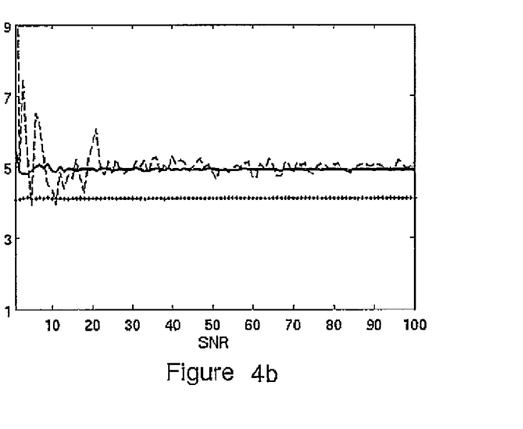

In order to qualitatively confirm the importance of the window width factor, f, simulations were carried out. These were based on complex image data acquired in a phantom measurement, taken to be the noise free ground truth. Unencoded FID points were then simulated under the presence of noise (SNR ranging from 1 to 100), and an inhomogeneity of 5µT/m in Y direction, according to Equation 8; $\Delta t$ was chosen to be the actual dwell time from the reference measurement, $\Delta t = 7.8 * 10^{-6}$s. Two situations were simulated: first with f denominating the temporal distance between the two points taken for estimating the discrete difference, and second with f representing the number of points taken into account, using a least squares fit. FIG. 4 gives the results for the two approaches, showing the detected inhomogeneity for three different settings of f: 100, 500 and 2000. The plots confirm the arguments from above: as can be seen, the influence of noise reduces with increased f and higher SNR, as expected. If f is chosen too high, on the other hand, the approximation of $e^{i\omega(\vec{r})\Delta t} \approx 1+i\omega(\vec{r})\Delta t$ is no longer valid and information "leaks" from the pure imaginary axis to the real axis, which manifests itself as a constant offset in the simulated simplified setup. This effect depends on the field seen by every coil element and thus occurs for every coil element at a different value $f_n$, rendering the mentioned magnitude weighted fitting necessary. Furthermore, it can clearly be seen, how results improve when the discrete slope is estimated over a time series of FID points, instead of using only two.

Phantom Measurements

Figure 5:
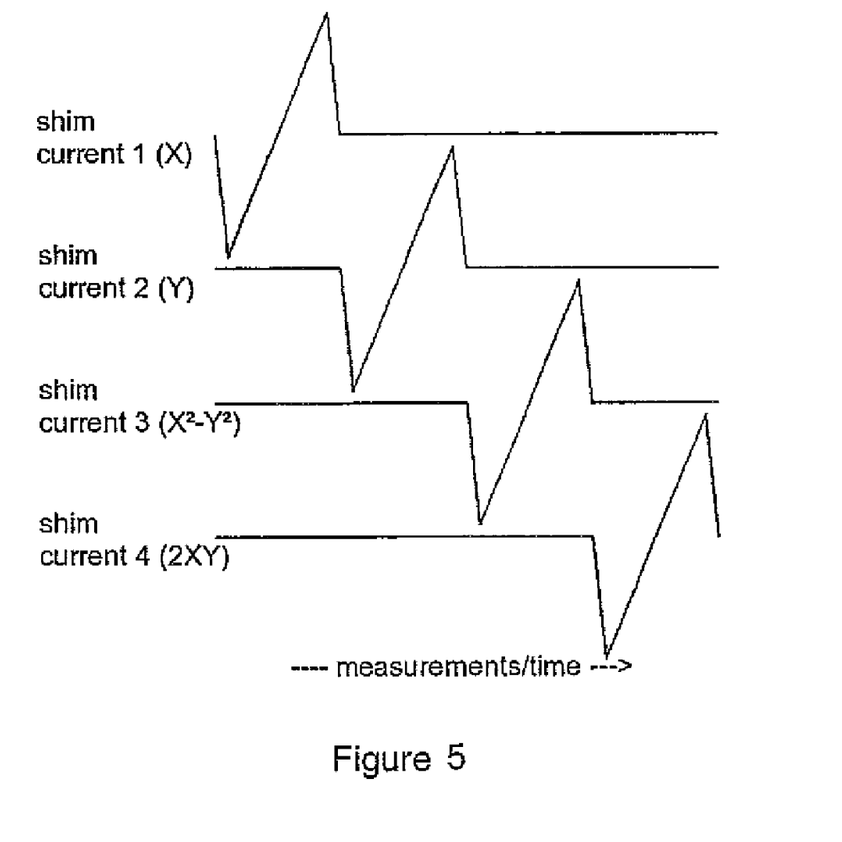
FIG. 5 is a schematic setup of the phantom measurements; assuming the number of coils to be modified during the measurements to be four, this illustration depicts how the settings of one coil after the other are changed over the time (in arbitrary units)
Figure 6A:
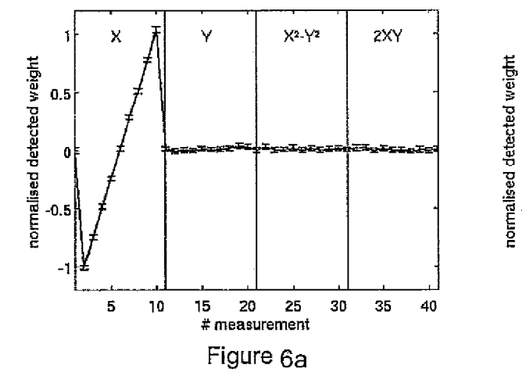
FIGS. 6a, 6b, 6c, 6d show the detected basis function weights for the 41 measurements, where the shim coils corresponding to X (a), Y(b), $X^2$-$Y^2$ (c) and 2XY (d) were altered one after the other (X and Y from −4 to +4µT/m, $X^2$-$Y^2$ and 2XY from −50 to +50µT/$m_2$; the detected values were normalised to 4 and 50 respectively). Shown are the averages over 128 FIDs, along with the error bars (±σ). The sections indicate during which measurements which coil was altered. A high agreement with the applied values (cf.
Figure 6B:
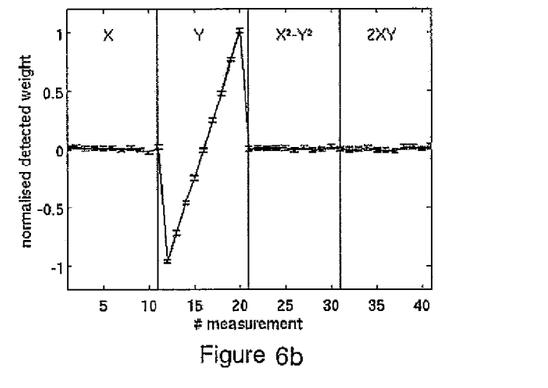
Figure 6C:
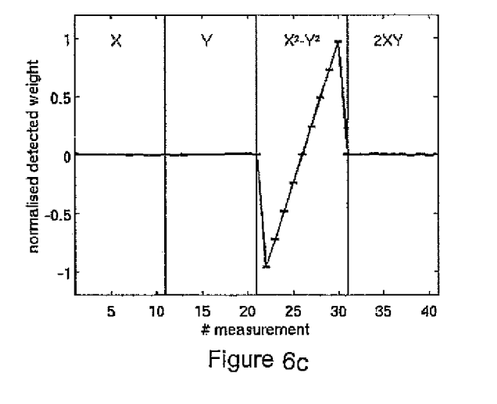
Figure 6D:
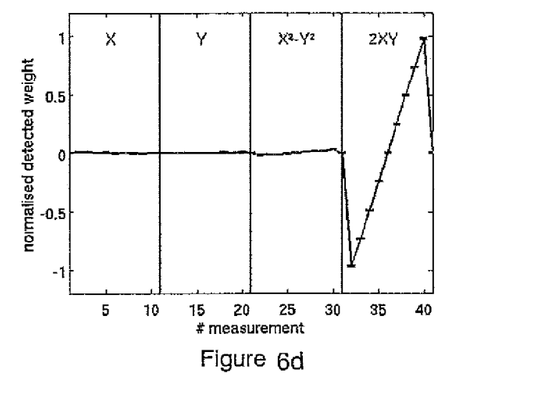

For assessing the reliability of the algorithm additional phantom measurements were carried out. During the measurements shim settings up to second order were purposely altered; for the sake of simplicity a slice in the X-Y-plane located in the iso-centre was measured, thus leaving the spherical harmonics corresponding to X, Y, $X^2-Y^2$ and 2XY. The measurements were divided into four sequential blocks, each block corresponding to one of the four mentioned coils; within each block the shim settings for the corresponding coil were manipulated over nine steps, while leaving the other coils unchanged. Before each block and after the last one a measurement with the original shim settings was inserted, thus leading to a total of 41 measurements; this setup is depicted schematically in FIG. 5. We decided to cover in steps of 1µT/m a range of ±4µT/m for the linear components; this order of magnitude was reported to be observable due to subject motion by Ward et al ([2]). In order to be able to better compare the results from first and second orders, the range for the second orders was chosen such that the maximum frequency over the chosen phantom corresponded to the one for the linear components, yielding a range of ±50µT/m² (in steps of 12.5µT/m²). The blocks were organised like follows: first the X component was altered, as described, then Y (same quantisation). Next $X^2-Y^2$ and 2XY followed.

As described above, the number of additional unencoded FIDs, $N_{unenc}$, was set to 128. FIG. 6 shows the mean of the detected weights over the 128 FIDs (in reference to the measurements with original shim settings) versus the applied shim values (a: X, b: Y, c: $X^2-Y^2$, d: 2XY); additionally error bars are given, with ±σ. Units were normalised to the respective maximum shim values (i.e. 4µT/m or 50µT/m²), both, for display and for the calculations described in the following.

From the graphs the following conclusions can qualitatively be drawn: first, the detected weights for the basis functions show visually a high correlation with the corresponding shim settings, i.e. the detected values reflect clearly the alterations. On the other hand, when a coil was not modified, the respective detected weights are reasonably close to zero (although some noise/coil interaction can be observed), with the standard deviations being within a tolerable range.

In order to quantify these results, covariances were calculated in the following way: calculations were performed block wise, i.e. the weights detected for every single one of the four basis functions were divided into sections corresponding to the four blocks described above (cf. FIG. 5), resulting in 4-by-4 sub blocks. Then for every sub block the covariance was calculated between the detected values and a line going from −1 to +1 (corresponding to the normalised applied values for the respectively active shim coil); the purpose of this was to disclose influences of one coil onto the respective other coils/basis functions.

The results for the described calculations can be found in Table 1; the values were normalised to the overall maximum detected covariance. As can be seen, the covariances indicate a high agreement between applied and detected settings; influences of coils on the respective other axes are very negligible.

TABLE 1 block wise covariances between detected and applied values (using the mean values shown in FIG. 46). The values were normalised to the maximum covariance.

|  | X | Y | $X^2-Y^2$ | 2XY |
|---|---|---|---|---|
| $X_{det.}$ | 1.000 | 0.018 | −0.004 | −0.012 |
| $Y_{det.}$ | −0.017 | 0.966 | −0.001 | 0.006 |
| $X^2-Y^2_{det.}$ | −0.004 | 0.007 | 0.952 | −0.004 |
| $2XY_{det.}$ | −0.006 | 0.002 | 0.022 | 0.959 |

Discussion

A new method for estimating B0 field inhomogeneities is disclosed, using sensitivity differences in coil arrays. The method is very fast and does not require any error-prone masking of phase images, which can be a disadvantage of field map based approaches. Furthermore it is very efficient concerning both, the data needed and the acquisition time.

As far as the amount of data is concerned, the method requires one complex reference image and minimum one additional series of points on an FID, without any encoding; the data needed are thus roughly half compared to conventional field mapping techniques. It is to be noted though, that reference images are usually needed for other purposes as well, for example for the planning of the scan. Thus, in practical settings (and where the coil array provides enough elements) only one additional time series of FID points may be required for shimming, which can be appended to standard sequences as an additional "phase encoding" step. In cases where the coil array does not provide enough elements, additional spatial encoding can be performed, thus using the method with an acceleration factor R of less than the maximum, slightly increasing the measurement time. As indicated by the presented results of the phantom experiments (cf. FIG. 6), errors can be reduced when averaging over the results of several FIDs giving a higher SNR at the cost of only a moderate increase in measurement time; but even a single FID yields very good results, as indicated by the small error bars.

The difference between the method presented here and previous fast shimming methods based on projections (R. Gruetter. Automatic, localized in vivo adjustment of all first- and second-order shim coils. Magn Reson Med, 29(6):804-811, June 1993.) is to be noted. In the latter approaches, spatial information is obtained exclusively through linear encoding along certain directions; information about B0 field inhomogeneities is obtained by repeating the projection with a slightly modified TE. In SSH on the other hand, spatial information is encoded in the spatially varying sensitivities of the elements of a coil array; information on the B0 field inhomogeneities is obtained by observing the temporal evolution of an FID and explaining the alterations using a set of basis functions. Usage of readout gradients for spatial encoding is thus not necessary and, due to the required observation of the temporal evolution, not possible. Furthermore, constant linear gradients are usually part of the set of basis functions to be fitted, B, and would thus be treated by SSH as inhomogeneities. Nevertheless, as has been shown above, for further spatial encoding SSH can be used with additional gradient pulses along any direction of the k-space. This additional encoding can be thought of as a discrete approximation to the spatial encoding properties of readout gradients, leading to a conceptual transition between SSH and traditional shimming methods. Since one of the benefits of SSH is its short measurement time, it seems impractical to use more than just a few of the "phase encoding" steps.

One special case where SSH might actually be used with gradients switched on during the measurement of the FID would be the "dynamic approach" described above, where the applied constant gradient compensates for the previously detected global linear B0 inhomogeneities and improves the accuracy and robustness of the SSH method. Applying too strong a gradient (or other field) on the other hand would yield the contrary and violate the approximation condition SSH is based upon.

The presented results (FIG. 6 and Table 1) prove the usability of the SSH method for shimming, showing that the detected B0 field inhomogeneities are in a good agreement with the applied field alterations. Calculating the correlations of the shown data, instead of the covariances, in order to characterise the degree of this agreement, would result in surprisingly high correlations on the off-diagonals—but with very low regression coefficients, i.e. negligible effects. The origin of these linear dependencies is yet to be determined. Possible sources could be actual hardware influences, non-optimal determination of $f_n$ (see above) or limitations of the approximation condition. It should be noted again that the profiles of the fields generated by the scanner were assumed to correspond to the ideal theoretical functions, interactions between shim coils were neglected for the scope of this work. As pointed out in literature (e.g. [5]), these assumptions may be considered wrong; measuring the truly generated field distributions along with possible inter coil interactions might improve the phantom measurements and avoid errors in in-vivo correction. Additional sources of errors might be eddy currents, which lead to phase errors in the reference image, and relaxation, which has been neglected in this work.

Although a true 3D shimming has not been demonstrated here due to the absence of a coil with a sufficiently large number of elements along Z axis, the method presented is easily extendable to three dimensions. It is to be noted, that there are several possibilities for implementing 3D shimming, such as using a 3D gradient echo image, three orthogonal 2D slices or a multi slice dataset. In principle the lack of coil elements in the third dimension can be overcome by using the suggested extension of additional encoded FID points along that direction. An estimate of the number of additional encoding steps required to form appropriate virtual sensitivities along the third direction still needs to be carried out.

Since in-vivo measurements might face initial difficulties due to relaxation, chemical heterogeneity and physiological effects, this proof-of-principle study is based on phantom measurements only. Simulations and experiments for in-vivo shim measurements as well as the robustness of the proposed protocol in clinical settings are subjects of following studies.

It is to be expected, though, that using a heterogeneous object should have a positive effect on the robustness of the method, due to the intrinsic spatial information carried by the spin density distribution; in the rather homogeneous phantom used here most spatial information was inherent in the coil sensitivities.

To summarise, the preliminary results presented in this note demonstrate the feasibility of the method: information encoded exclusively in coil sensitivities can indeed be transformed into field inhomogeneity space.

Further embodiments of the present invention can be derived by combining the proposed detection and correction method with established imaging techniques. This can be achieved by interleaving the acquisitions for determination of the B0 field inhomogeneities in an arbitrary pattern with a series of spin excitations and signal acquisitions given by the selected imaging method, e.g. time series measurement with echo-planar imaging (EPI).

Although there has been hereinabove described a sense shimming (SSH): a fast approach for determining B0 field inhomogeneities using sensitivity encoding in accordance with the present invention for the purpose of illustrating the manner in which the invention may be used to advantage, it should be appreciated that the invention is not limited thereto. That is, the present invention may suitably comprise, consist of, or consist essentially of the recited elements. Further, the invention illustratively disclosed herein suitably may be practiced in the absence of any element which is not specifically disclosed herein. Accordingly, any and all modifications, variations or equivalent arrangements which may occur to those skilled in the art, should be considered to be within the scope of the present invention as defined in the appended claims.

What is claimed is:

1. A magnetic resonance (NMR) method for fast detection and optional correction of detected B0 field inhomogeneities in NMR apparatus, the method comprising:
   providing an NMR magnetic structure for generating a B0 field, the magnetic structure having field manipulation coils;
   using a multiple separate element RF coil assembly for detecting field inhomogeneity spatial distribution of resonance frequencies using sensitivity differences from the coil assembly, and one or several previously acquired reference data sets and one or several points on a free induction decay (FID); and
   adjusting currents in the field manipulation coils of the NMR apparatus to correct, as desired, the detected B0 field inhomogeneities.

2. The magnetic resonance (NMR) method according to claim 1 further comprising representing of B0 field inhomogeneity information in terms of a basis function set.

3. The magnetic resonance (NMR) method according to claim 2 further comprising using a spherical harmonic set as a basis function set.

4. The magnetic resonance (NMR) method according to claim 2 further comprising using fields actually generated by the field manipulation coils available, including linear field gradients, as a basis function set.

5. The magnetic resonance (NMR) method according to claim 2 further comprising using basis function sets in two or three spatial dimensions, covering a volume of interest (VOI) or one or several sub volumes, simultaneously or sequentially, for representing the B0 field inhomogeneity information.

6. The magnetic resonance (NMR) method according to claim 5 further comprising using time as additional dimension for representing the B0 field inhomogeneity information.

7. The magnetic resonance (NMR) method according to claim 1 further comprising using additional gradient pulses along one or several axes prior to the acquisition of one or several points on the FID.

8. The magnetic resonance (NMR) method according to claim 1 further comprising exciting a single slice of a volume of interest (VOI) prior to the acquisition of a reference data set.

9. The magnetic resonance (NMR) method according to claim 1 further comprising using several reference data sets consisting of several single slices of the VOI in any orientation relative to each other.

10. The magnetic resonance (NMR) method according to claim 1 further comprising exciting one or several arbitrary regions of a volume of interest (VOI) prior to the acquisition of one or several reference data sets.

11. The magnetic resonance (NMR) method according to claim 1 further comprising exciting a single slice of a volume of interest (VOI) prior to the acquisition of one or several points on an FID.

12. The magnetic resonance (NMR) method according to claim 1 wherein several FID signals from several single slices of a volume of interest (VOI) in any orientation relative to one another are utilized.

13. The magnetic resonance (NMR) method according to claim 1 further comprising exciting one or several arbitrary regions of a volume of interest (VOI) prior to the acquisition of one or several FIDs.

14. The magnetic resonance (NMR) method according to claim 1 further comprising preceding and/or combining the excitation by/with saturation techniques.

15. The magnetic resonance (NMR) method according to claim 1 further comprising acquiring a single acquisition of one or several reference data sets and acquiring of FID data over one or several iterations, with one iteration consisting of the measurement of one or several points on one or several FIDs followed by an adjustment of the reference data, according to the detected B0 field inhomogeneities, the number of iterations limited to a maximum number or to convergence criteria.

16. The magnetic resonance (NMR) method according to claim 1 further comprising interleaving described determination of the B0 field inhomogeneities in an arbitrary pattern with a given series of spin excitations and NMR signal acquisitions.

* * * * *